United States Patent [19]

Baglee et al.

[11] Patent Number: 5,374,580

[45] Date of Patent: * Dec. 20, 1994

[54] METHOD OF FORMING HIGH DENSITY DRAM HAVING INCREASED CAPACITANCE AREA DUE TO TRENCH ETCHED INTO STORAGE CAPACITOR REGION

[75] Inventors: David A. Baglee, Houston; Robert R. Doering, Plano; Gregory J. Armstrong, Houston, all of Tex.

[73] Assignee: Texas Instruments Incorporated, Dallas, Tex.

[*] Notice: The portion of the term of this patent subsequent to May 16, 2006 has been disclaimed.

[21] Appl. No.: 129,011

[22] Filed: Sep. 30, 1993

Related U.S. Application Data

[60] Continuation of Ser. No. 914,819, Aug. 14, 1992, abandoned, which is a division of Ser. No. 758,318, Aug. 27, 1991, Pat. No. 5,170,234, which is a continuation of Ser. No. 627,371, Jul. 3, 1984, abandoned.

[51] Int. Cl.$^5$ .................... H01L 21/70; H01L 27/00
[52] U.S. Cl. ........................ 437/52; 437/60; 437/919
[58] Field of Search ............... 437/52, 60, 919

[56] References Cited

U.S. PATENT DOCUMENTS

| | | | |
|---|---|---|---|
| 4,326,332 | 4/1982 | Kenney | 437/203 |
| 4,353,086 | 10/1982 | Jaccodine et al. | 257/301 |
| 4,397,075 | 8/1983 | Fatula, Jr. et al. | 437/52 |
| 4,830,981 | 5/1989 | Baglee et al. | 437/52 |

FOREIGN PATENT DOCUMENTS 55-11365  1/1980  Japan.

Primary Examiner—Olik Chaudhuri
Assistant Examiner—H. Jey Tsai
Attorney, Agent, or Firm—Jacqueline J. Garner; Richard L. Donaldson; William E. Hiller

[57] ABSTRACT

A dynamic one-transistor read/write memory cell employs a trench capacitor to increase the magnitude of the stored charge. The trench is etched into the silicon surface at a diffused N+ capacitor region similar in structure to the N+ bit line, then thick oxide is grown over the bit line and over the capacitor region, but not in the trench. The upper plate of the capacitor is a polysilicon layer extending into the trench and also forming field plate isolation over the face of the silicon bar. A refractory metal word line forms the gate of the access transistor at a hole in the polysilicon field plate.

7 Claims, 3 Drawing Sheets

METHOD OF FORMING HIGH DENSITY DRAM HAVING INCREASED CAPACITANCE AREA DUE TO TRENCH ETCHED INTO STORAGE CAPACITOR REGION

This application is a continuation, of application Ser. No. 07/914,819, filed Aug. 14, 1992 abandoned, which is a division of Ser. No. 07/758,318 filed Aug. 27, 1991; U.S. Pat. No. 5,170,634 which is a continuation of Ser. No. 06/627,371 filed Jul. 3, 1984 abandoned.

BACKGROUND OF THE INVENTION

This invention relates to manufacture of semiconductor devices, and more particularly to a dynamic read/write memory cell of the MOS VLSI type.

Semiconductor dynamic RAM devices of the type shown in U.S. Pat. No. 4,081,701 issued to White, McAdams and Redwine (a 16K RAM), or U.S. Pat. No. 4,293,993 issued to McAlexander, White and Rao (a 64K RAM), have been manufactured by processes of the type described in U.S. Pat. Nos. 4,055,444 or 4,388,121, both issued to G. R. M. Rao; all of these patents are assigned to Texas Instruments. In order to reduce the size of a dynamic RAM cell to the level needed to produce very high density RAMs, such as the 1-Megabit DRAM, various methods of reducing the capacitor size have been proposed. The magnitude of the capacitor must be maintained at no less than a certain value so that sufficient charge is stored. One method of reducing capacitor area yet maintaining adequate charge storage is to reduce the oxide thickness as explained in U.S. Pat. No. 4,240,092 issued to Kuo, assigned to Texas Instruments; this approach reaches a limit in the area of about 100 to 200 Å oxide thickness because of yield and reliability problems. Another way of increasing the capacitance per unit area is to etch a groove, or trench, in the capacitor region, thus increasing the area; an example of this method is shown in U.S. Pat. No. 4,225,945, also assigned to Texas Instruments.

It is the principal object of this invention to provide an improved high density dynamic RAM cell, particularly with an increased capacitance area due to a trench etched into the storage capacitor region. Another object is to provide an improved method of making trench capacitor type dynamic RAM cells. A further object is to provide a simple and reliable process for forming trench capacitors.

SUMMARY OF THE INVENTION

In accordance with one embodiment of the invention, a dynamic one-transistor read/write memory cell employs a trench capacitor to increase the magnitude of the stored charge. The trench is etched into the silicon surface at a diffused N+ capacitor region similar in structure to the N+ bit line, then thick oxide is grown over the bit line and over the capacitor region, but not in the trench. The upper plate of the capacitor is a polysilicon layer extending into the trench and also forming field plate isolation over the face of the silicon bar. A refractory metal word line forms the gate of the access transistor at a hole in the polysilicon field plate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
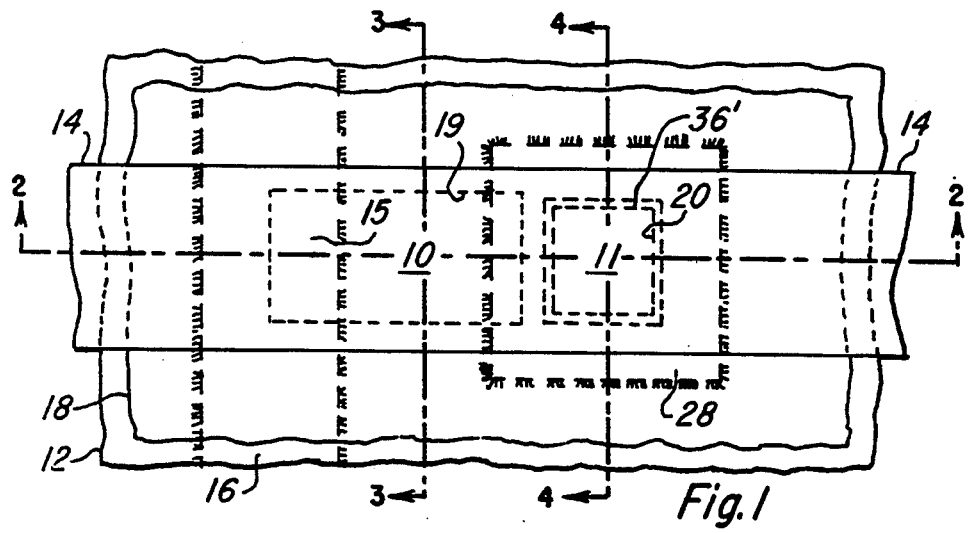
FIG. 1 is a plan view, greatly enlarged, of a small part of a memory cell array in a semiconductor dynamic read/write memory, including a memory cell according to the invention.
Figure 2:
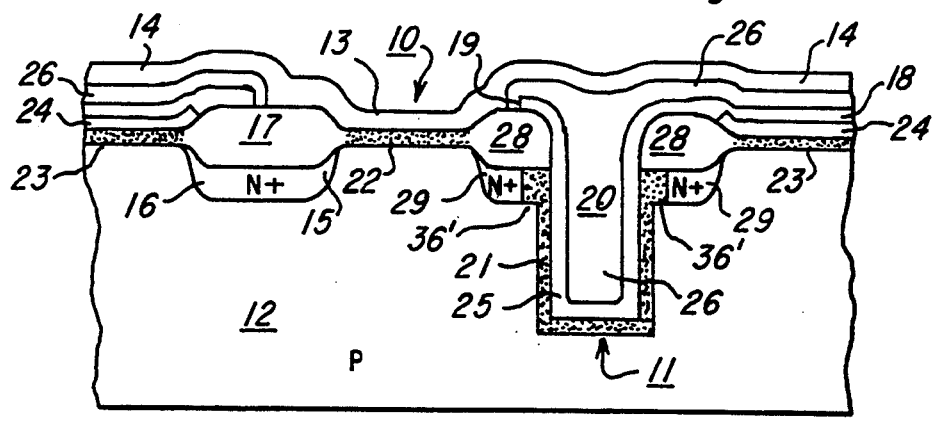
FIG. 2 is an elevation view, in section, of the cell of FIG. 1, taken along the line 2—2 in FIG. 1.
Figure 3:
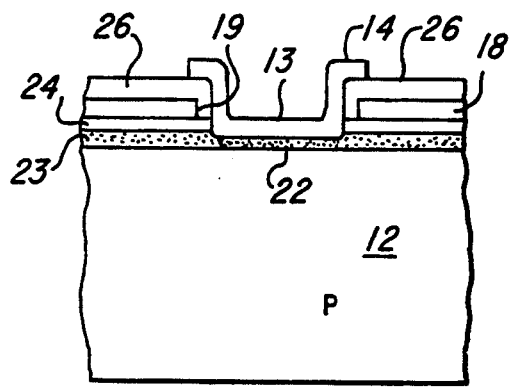
FIG. 3 is an elevation view, in section, of the cell of FIG. 1, taken along the line 3—3 in FIG. 1.
Figure 4:
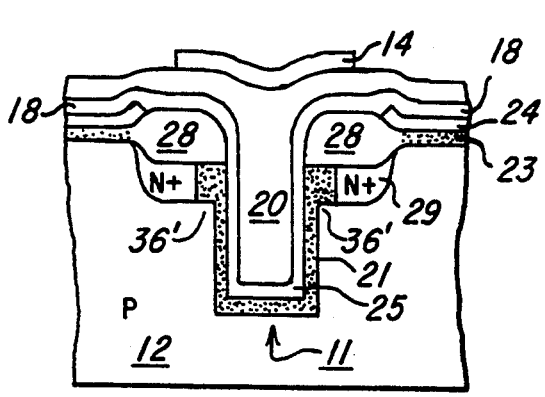
FIG. 4 is an elevation view, in section, of the cell of FIG. 1, taken along the line 4—4 in FIG. 1.
Figure 5:
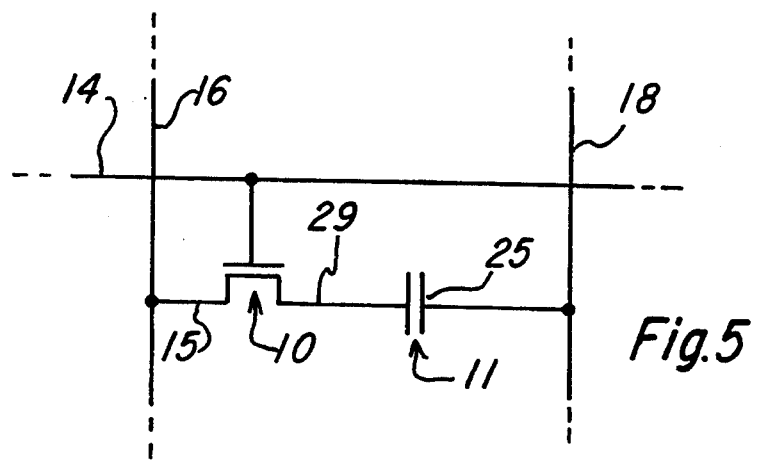
FIG. 5 is an electrical schematic diagram of the memory cell o f FIGS. 1–4.
Figure 6:
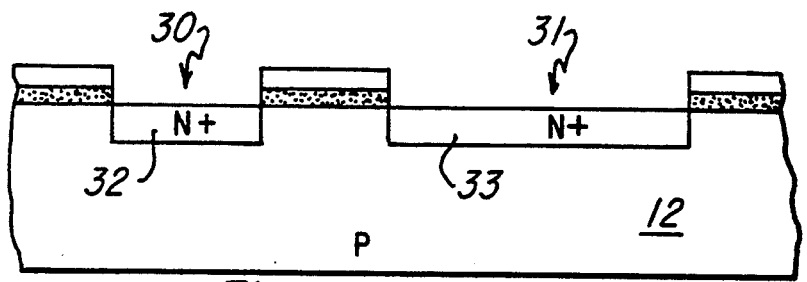
FIGS. 6–9 are elevation views in section of the cell of FIG. 1, corresponding to FIG. 2, at successive stages in the manufacture thereof.

Referring to FIGS. 1–5, a one-transistor dynamic memory cell is shown which is constructed according to the invention. This cell has an N-channel access transistor 10 and a storage capacitor 11 formed in a silicon substrate 12. The transistor 10 has a metal gate 13 which is part of an elongated strip 14 forming a row (or word) line for the memory array. The drain 15 of the transistor is part of an elongated bit line 16, perpendicular to the word line 14. The portion of the substrate shown is a very small part of a silicon bar of perhaps 150×400 mils containing $2^{20}$ or 1,048,576 of these cells in an array of rows and columns, generally as shown in U.S. Pat. No. 4,630,240 by Poteet & Chang, assigned to Texas Instruments.

The bit line 16 is buried beneath a thick thermal oxide layer 17, so the metal word line can pass directly over the bit line. Isolation laterally along the face is provided by a field plate 18, composed of polysilicon in this example, and electrically connected to the substrate voltage Vss. A hole 19 in the field plate 18 defines the area of the gate 13 of the transistor 10.

According to the invention, the capacitor 11 includes a trench 20, which is a hole etched into the silicon by an anistropic etch technique such as RIE. The trench 20 is about one micron wide and three microns deep. A thin silicon oxide layer 21 provides the capacitor dielectric, and thin silicon oxide 22 the transistor gate insulator. A thicker oxide coating 23 and a silicon nitride layer 24 provide the insulator beneath the field plate 18. The grounded field plate 18 also provides a flat surface for the metal line 14, as well as insulating the polysilicon 16 from the metal word line.

The trench 20 and the capacitor 11 are formed in a square area of field oxide 28 having a N+ region 29 beneath it, similar to the oxide 17 and bit line 16. This N+ region 29 functions as the source of the access transistor 10, and is spaced from the drain 15 by the channel length of this transistor.

Figure 7:
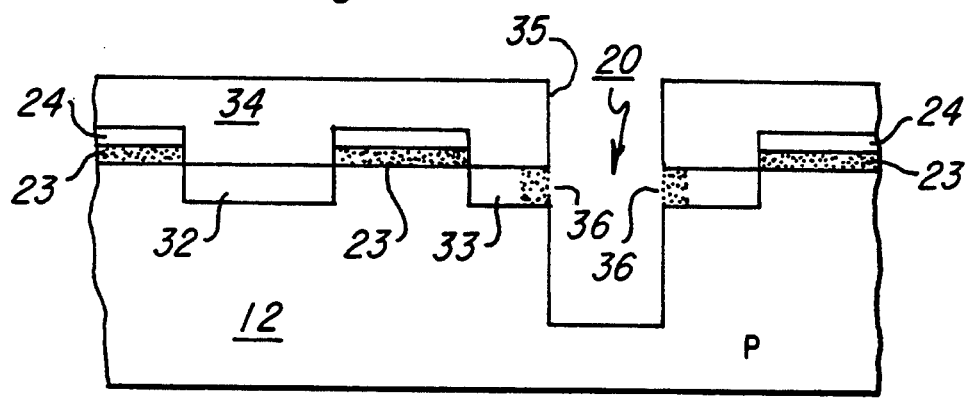

A method of making the cell of FIGS. 1–5 will be described with respect to FIGS. 6–9. A silicon slice has a layer of thermal silicon oxide 23 of about 1000 Å grown on the face, then a layer 24 of silicon nitride deposited over the oxide. The oxide-nitride sandwich is patterned by photolithographic steps, leaving an exposed area 30 for the bit line 16 and an area 31 where the capacitor will be formed. An ion implant is performed to create t he N+ regions 32 and 33 which will later form the N+ bit line 16 and N+ region 29. Referring to FIG. 7 an etch mask 34 is deposited for the purpose of defining the trench. This etch mask is silicon oxide of a thickness of about 8000 Å, formed by low pressure chemical vapor deposition. Photoresist could also be used if the etch selectivity of silicon to photoresist is high enough. A hole 35 is formed in the layer 34 by photolithography to define the trench 20. Using an anistropic etch, such as RIE (reactive ion etch) the trench 20 is created in the capacitor region to a depth of about three microns. Actually, the bottom of the trench may be narrower than the top, rather than being squared off, so the trench may be more cone-shaped than perfectly rectangular, depending upon the etch process used.

Figure 8:
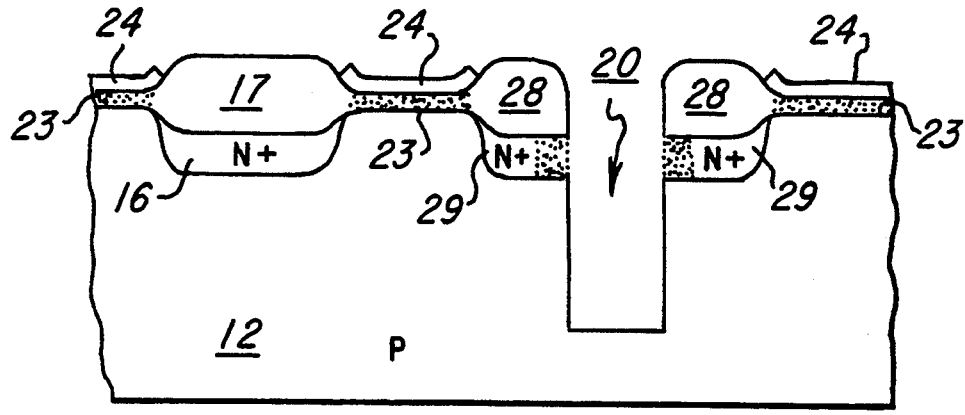
Figure 9:
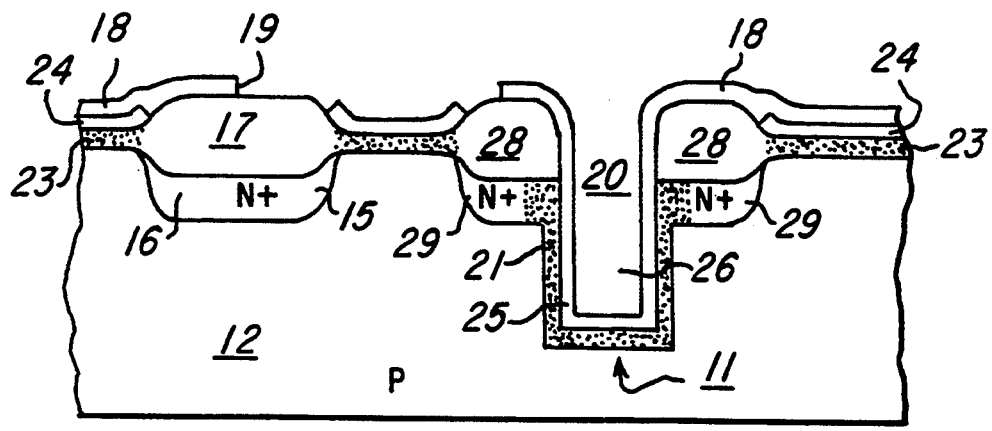

The trench mask 34 is stripped off, using a conventional oxide etch such as HF since the etch will stop on the nitride 24. Turning to FIG. 8, the oxide 17 and 28 is now grown over the N+ regions 32 and 33. The oxide grows many times faster on the N+ silicon than on the very lightly doped silicon in the trench 20, so the thickness of the oxide 17 and 28 is about 4000 Å while only about 200 Å the trench. This thin oxide is grown in the trench and stripped, then regrown as the oxide 21. A seen in FIG. 9, a layer of polysilicon is deposited by an isotropic process so it coats the sidewalls of the trench and the face of the slice to about the same thickness, to about 2500 Å. Next, an oxide layer 26 is deposited over the entire face of the slice to planarize the face and fill up the trench 20; the oxide 26 will also isolate the word line from the face. This polysilicon/oxide stack is patterned using photoresist to leave the field plate 18 and capacitor plate 25; i.e., the hole 19 is cut for the transistor 10.

Referring back to FIGS. 1–4, the oxide in the gate area is stripped and regrown as the oxide 22, and at this point thermal oxide is grown over the exposed edge of the polysilicon around the periphery of the hole 19. Then the word line is formed by depositing a layer of molybdenum over the entire face of the slice and patterning it by photolighography to leave the gate 13 and word line 14. A protective coating is added on top, (not shown) and patterned to expose bonding pads, then the slice is tested, scribed and broken into individual bars, and the bars mounted in semiconductor packages.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a memory cell at a face of a semiconductor body, comprising the steps of:
   applying an oxidation mask to said face patterned to expose a bit line area and a capacitor area,
   implanting an impurity into said face in said bit line area and said capacitor area to produce doped areas, said implant being masked by said oxidation mask,
   masking said face to expose only a part of said capacitor area of said face and etching said face in said part to create a trench which is deeper than its width,
   growing a thermal oxide on said face in said bit line area and said capacitor area, said impurity creating doped regions beneath said thermal oxide, said thermal oxide growing much thinner in said trench than over said doped areas,
   applying conductive layer over said face extending into said trench insulated from the body by insulator coating,
   opening a hole in said conductive layer in a channel area between said bit line and said capacitor area,
   and depositing a conductor on said face and patterning the conductor to leave a transistor gate in said hole and a word line extending along said face perpendicular to said bit line.

2. A method according to claim 1 wherein said body is silicon, said conductive layer is polycrystalline silicon, said conductor is molybdenum, and said impurity is N-type.

3. A method according to claim 1 wherein said oxidation mask is silicon nitride, and said silicon nitride is left in place on said face beneath said conductive layer except at said bit line area, said capacitor area and said channel area.

4. A method according to claim 11 including the step of removing said oxidation mask only from said channel area after said step of growing thermal oxide, and leaving said oxidation mask beneath said conductive layer.

5. A method according to claim 1 including the step of filling said trench with insulative material after said step of applying a conductive layer.

6. A method according to claim 1 wherein said body is P type silicon, said conductor is metal, said impurity is N type; and including the step of removing said oxidation mask only from said channel area after said step of growing thermal oxide.

7. A method according to claim 6 wherein said oxidation mask is silicon nitride, and said silicon nitride is left in place on said face underneath said conductive layer except at said bit line area, said capacitor area, and said channel area.

* * * * *